(12) United States Patent
Aksyuk et al.

(10) Patent No.: US 6,781,744 B1
(45) Date of Patent: Aug. 24, 2004

(54) AMPLIFICATION OF MEMS MOTION

(75) Inventors: Vladimir A. Aksyuk, Piscataway, NJ (US); Omar D. Lopez, Summit, NJ (US); Flavio Pardo, New Providence, NJ (US); Maria E. Simon, New Providence, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/459,108

(22) Filed: Jun. 11, 2003

(51) Int. Cl.[7] ............................................... G02B 26/00
(52) U.S. Cl. ....................................... 359/290; 359/291
(58) Field of Search ............................... 359/290–292, 359/295, 198; 310/90, 309

(56) References Cited

U.S. PATENT DOCUMENTS

| | | | |
|---|---|---|---|
| 5,501,893 A | 3/1996 | Laermer et al. | 428/161 |
| 5,629,790 A | 5/1997 | Neukermans et al. | 359/198 |
| 6,201,631 B1 | 3/2001 | Greywall | 359/245 |
| 6,480,320 B2 * | 11/2002 | Nasiri | 359/291 |
| 6,614,581 B2 * | 9/2003 | Anderson | 359/295 |
| 2004/0061923 A1 * | 4/2004 | Greywall | 359/291 |

* cited by examiner

*Primary Examiner*—Georgia Epps
*Assistant Examiner*—M. Hasan

(57) ABSTRACT

A MEMS device having a movable mirror and a movable actuator plate mechanically coupled together such that a relatively small displacement of the plate results in mirror rotation by a relatively large angle. In a representative embodiment, the mirror and actuator plate are supported on a substrate. The actuator plate moves in response to a voltage difference applied between the plate and an electrode located on the substrate beneath that plate. One or more springs attached to the plate provide a counteracting restoring force when they are stretched from their rest positions by the plate motion. A spring attached between the actuator plate and the mirror transfers the motion of the actuator plate to the mirror such that, when the actuator plate moves toward the substrate, the mirror moves away from the substrate. A representative MEMS device of the invention configured with a mirror that is about 100 μm in length is capable of producing the mirror rotation angle of about 15 degrees using an actuator voltage of only about 50 V.

20 Claims, 8 Drawing Sheets

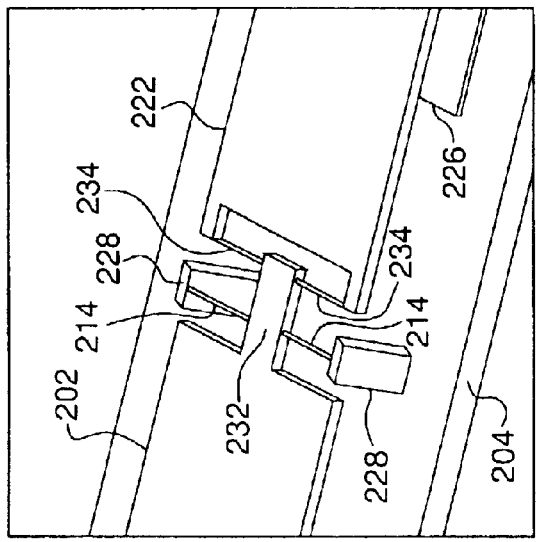
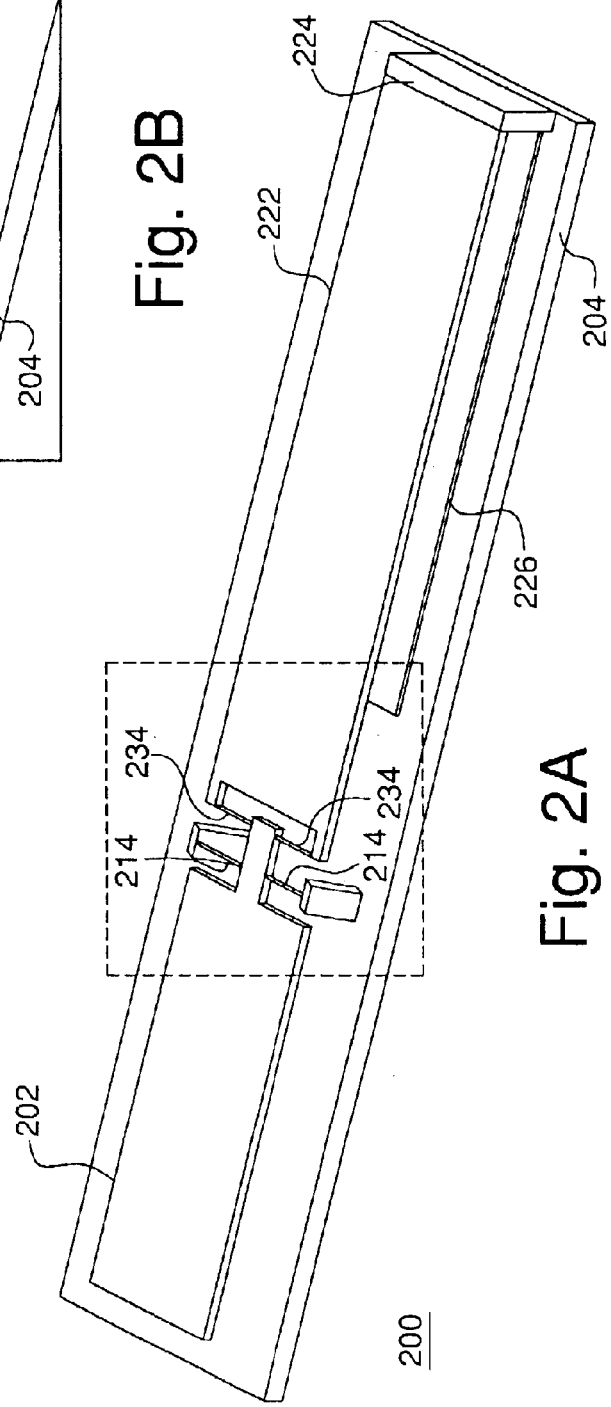
Fig. 2B
Fig. 2A

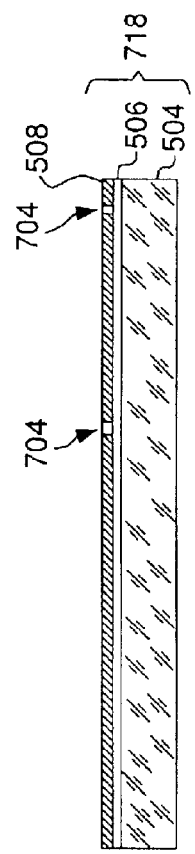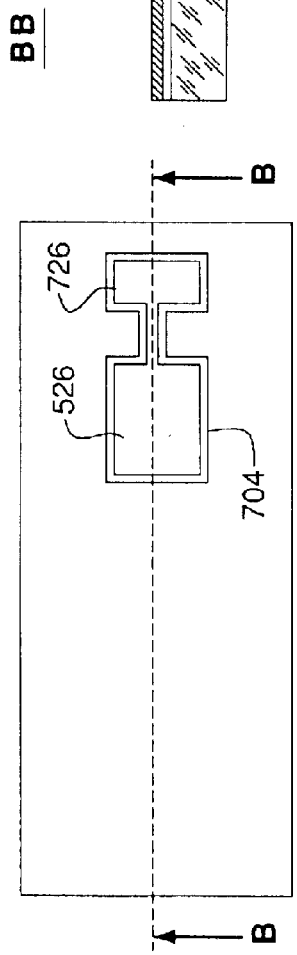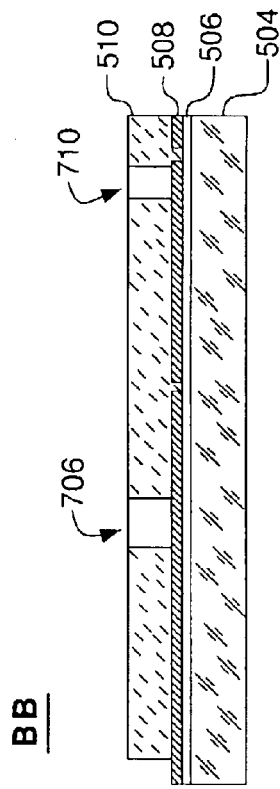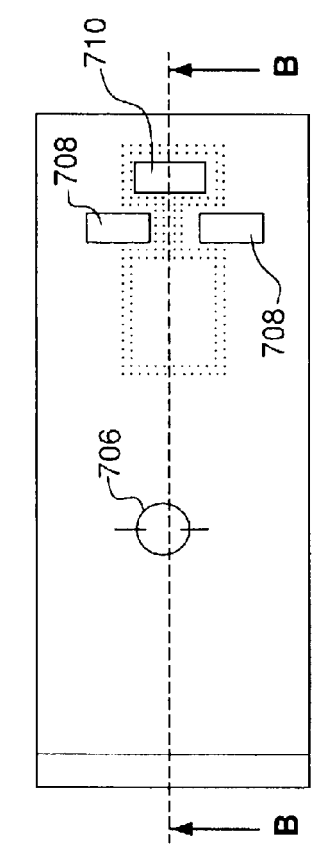
Fig. 7B
Fig. 7D
Fig. 7A
Fig. 7C

AMPLIFICATION OF MEMS MOTION

BACKGROUND OF THE INVENTION

1. Field of the Invention

The invention relates to optical communication equipment and, more specifically, to micro-electromechanical devices for use in such equipment.

2. Description of the Related Art

Optical communication equipment often employs micro-electromechanical systems (MEMS). A typical MEMS system may include an array of micro-machined mirrors, each mirror individually movable in response to an electrical signal. Such an array may be employed in an optical cross-connect, in which each mirror in the array receives a different beam of light, for example, from an input optical fiber. The beam is reflected from the mirror and can be redirected to a different location, e.g., at which is located an output optical fiber. The particular output fiber may be selected by rotating the mirror. More details on the principle of operation and methods of manufacture of MEMS devices having mirror arrays may be found, for example, in commonly assigned U.S. Pat. No. 6,201,631, the teachings of which are incorporated herein by reference.

One problem with prior art MEMS devices having relatively large (e.g., about 100 $\mu$m in length) mirrors is that the spacing between the mirror and the corresponding actuating electrode(s) has to be relatively large to achieve relatively large (e.g., about 10°) rotation angles, However, increasing the spacing leads to a corresponding increase in the voltage that has to be applied to the electrodes to rotate the mirror. As appreciated by those skilled in the art, it is often undesirable and/or impractical to have MEMS devices whose operating voltages exceed about 100 V.

SUMMARY OF THE INVENTION

Problems in the prior art are addressed, in accordance with the principles of the present invention, by a MEMS device having a movable mirror and a movable actuator plate mechanically coupled together such that a relatively small displacement of the plate results in mirror rotation by a relatively large angle.

In a representative embodiment, the mirror and actuator plate are supported on a substrate. The actuator plate moves in response to a voltage difference applied between (a) an electrode located on the substrate beneath the plate and (b) the plate itself. One or more springs attached to the plate provide a counteracting restoring force when they are stretched from their rest positions by the plate motion. The mirror has a handle portion configured as a lever arm. A spring attached between the actuator plate and the handle portion transfers the motion of the actuator plate to the mirror such that, when the actuator plate moves toward the substrate, the spring pulls the handle portion to move the mirror away from the substrate. Advantageously, relatively large mirror rotation angles may be achieved using relatively low actuator voltages. For example, a mirror that is about 100 $\mu$m in length may be rotated by an angle of about 15 degrees using an actuator voltage of only about 50 V.

In another representative embodiment of the invention, a MEMS device has first and second plates, each supported on, and positioned offset from, a substrate. The second plate is rotatably connected to the substrate. The connection defines a rotation axis and first and second portions of the second plate including its opposite ends with respect to the rotation axis. One end of the first plate is movably connected to the first portion of the second plate, while the other end of the first plate is connected to the substrate.

BRIEF DESCRIPTION OF THE DRAWINGS

FIGS. 2A–B show perspective views of a MEMS device according to one embodiment of the present invention;

FIGS. 7A–H illustrate representative fabrication steps of the MEMS device of FIG. 5 according to one embodiment of the present invention.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Figure 1B:
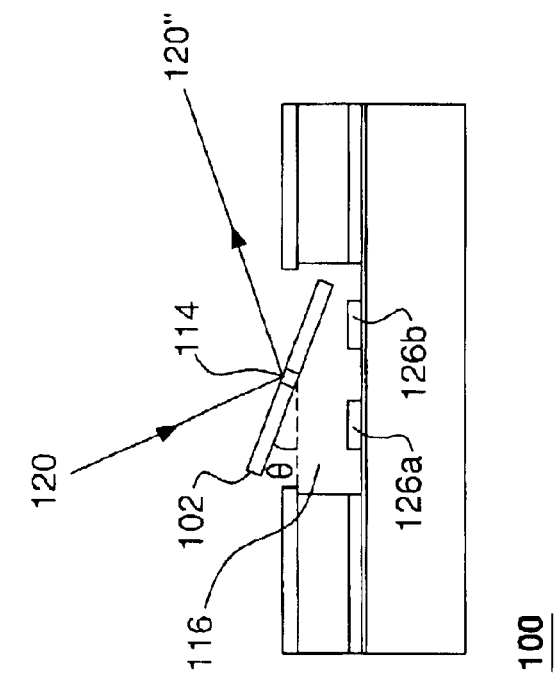
FIGS. 1A–B show cross-sectional views of a representative prior art MEMS device having a movable mirror.
Figure 1A:
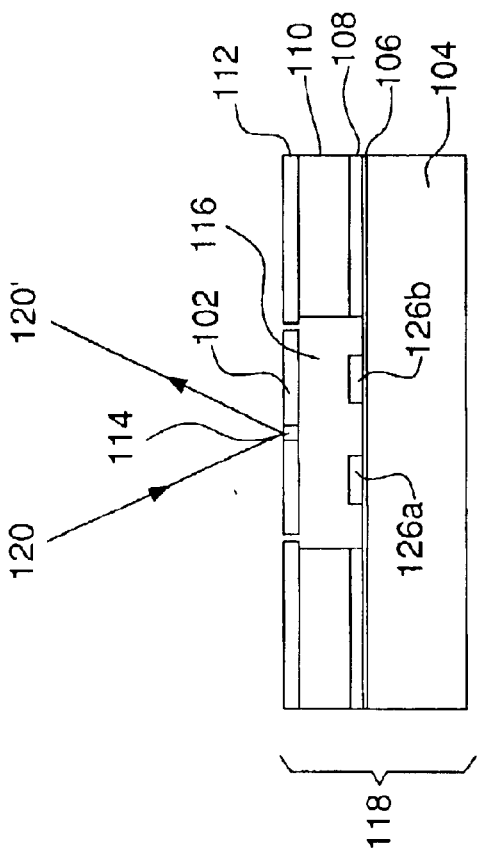

FIG. 1A shows a cross-sectional view of a representative prior art MEMS device 100 that may be used in an optical cross-connect. Device 100 includes a movable mirror 102 formed in a top layer 112 of a wafer 118 using, e.g., reactive ion etching. Wafer 118 has four additional layers: a substrate layer 104, two insulating layers 106 and 110, and a middle layer 108. Insulating layers 106 and 110 electrically isolate middle layer 108 from substrate layer 104 and top layer 112, respectively. Substrate layer 104, middle layer 108, and top layer 112 may be silicon, and insulating layers 106 and 110 may be silicon oxide. Mirror 102 is supported above a cavity 116 by a pair of springs 114, e.g., torsional members, connected to top layer 112. Device 100 further includes electrodes 126a–b formed using middle layer 108 and located in cavity 116 beneath mirror 102. Mirror 102 and electrodes 126a–b form an actuator of device 100.

FIG. 1B illustrates how a beam of light 120 impinging on mirror 102 can be redirected from direction 120 (FIG. 1A) to direction 120 using mirror rotation. Mirror 102 rotates about the axis defined by springs 114 in response to voltages applied to electrodes 126a–b. For example, when electrode 126b is biased, mirror 102 rotates clockwise, as shown in FIG. 1B. Similarly, when electrode 126a is biased, mirror 102 rotates counterclockwise. Changing bias voltages changes the rotation angle ($\theta$) thus enabling a cross-connecting function of device 100.

As indicated in FIG. 1B, an increase in $\theta$ causes an edge of mirror 102 to approach and eventually touch the bottom of cavity 116. As a result, the maximum possible rotation angle for mirror 102 is limited by the depth of said cavity. Therefore, to increase the value of the maximum rotation angle while keeping the size of mirror 102 fixed, one has to implement device 100 with an increased depth of cavity 116. For example, to realize a value of the maximum rotation angle of about 10 degrees for mirror 102 that is approximately 200 μm in length, the depth of cavity 116 has to be about 17 μm. However, for cavity depths in the range of tens of microns, the fabrication of device 100 becomes relatively difficult and, in some cases, also prohibitively expensive. In addition, due to the relatively large separation between mirror 102 and electrodes 126*a–b* (FIG. 1A), rotation of mirror 102 would require relatively large actuation voltages. However, as appreciated by those skilled in the art, it is typically desirable to have actuation voltages below about 100 V.

FIGS. 2A–B show perspective views of a MEMS device 200 according to one embodiment of the present invention. Device 200 includes a movable mirror 202 mechanically coupled to a movable actuator plate 222, both supported on a substrate 204. One end of plate 222 is attached to substrate 204 using a spacer 224 and the other end of the plate is suspended above the substrate. In one embodiment, the end of plate 222 adjacent to spacer 224 is fixedly attached to said spacer, e.g., as shown in FIG. 2. In another embodiment, plate 222 is rotatably attached to spacer 224 using a pair of torsional members (not shown). As can be appreciated by one skilled in the art, other types of attachment between plate 222 and spacer 224 can also be used. An electrode 226 that is similar to electrodes 126*a–b* (FIG. 1) is located on substrate 204 beneath plate 222. Plate 222 and electrode 226 form an electrostatic actuator of device 200. Depending on the type of attachment between plate 222 and spacer 224, when electrode 226 is biased with respect to the plate, the plate may bend (e.g., similar to a springboard) or move (e.g., rotate) substantially undeformed. When motion of plate 222 is not pure rotation, this motion may be quantified using a corresponding effective angle (α') determined from Equation (1) as follows:

$$\sin \alpha' = \frac{h}{L} \quad (1)$$

where h is the displacement of the suspended end of plate 222 and L is the length of the plate.

FIG. 2B shows an enlarged view of the mechanical attachment between mirror 202 and plate 222. Mirror 202 is supported above substrate 204 by a pair of torsional members 214, each attached between a corresponding stationary post 228 and a handle portion 232 of the mirror. A pair of torsional members 234 is attached between handle portion 232 and the suspended end of plate 222 to mechanically couple together plate 222 and mirror 202.

Figure 3A:
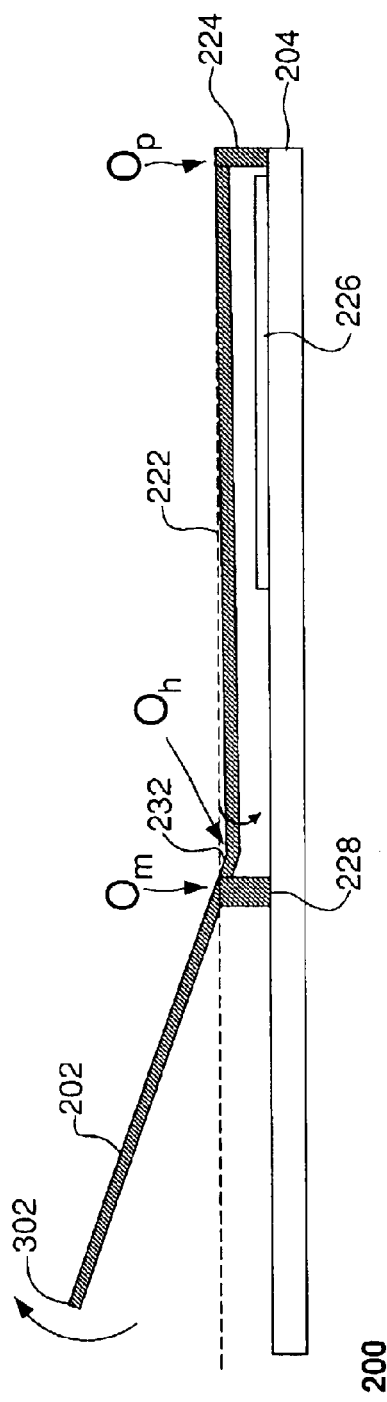
FIGS. 3A–B schematically illustrate motion of device parts during operation of the device shown in FIG. 2.
Figure 3B:
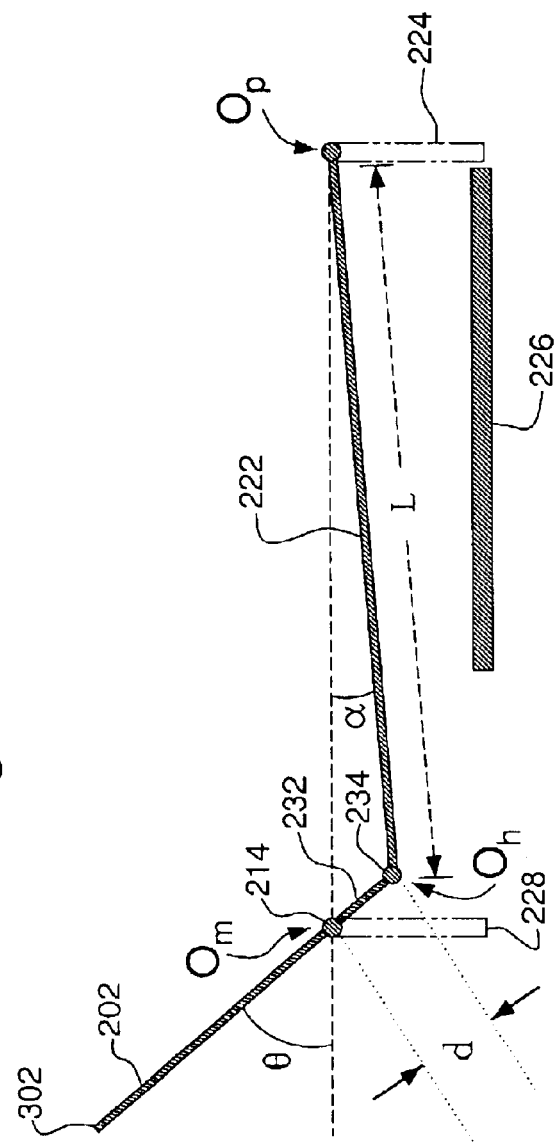

FIGS. 3A–B schematically illustrate motion of parts of device 200 during operation according to one embodiment of the present invention, in which plate 222 is rotatably attached to spacer 224. More specifically, FIG. 3A is a side view of device 200; and FIG. 3B is a schematic diagram corresponding to the side view of FIG. 3A and illustrating the motion of mirror 202 and plate 222. The dashed lines in FIGS. 3A–B indicate the initial (rest) position of mirror 202 and plate 222 when no voltages are applied to device 200. When electrode 226 is biased relative to plate 222, an attractive electrostatic force is generated between the electrode and the plate. This force causes plate 222 to rotate counterclockwise, as indicated by the downward arrow in FIG. 3A, about the axis defined by the attachment between plate 222 and spacer 224 and labeled O$_p$ in FIGS. 3A–B. Due to the coupling between mirror 202 and plate 222, this motion of the suspended end of the plate is transferred to handle portion 232 of the mirror and causes the mirror to rotate clockwise, as indicated by the upward arrow in FIG. 3A, about the axis defined by torsional members 214 and labeled O$_m$ in FIGS. 3A–B.

FIG. 3B schematically illustrates rotation-angle amplification achieved in device 200. Suppose that plate 222 is rotated by angle α. Then, the corresponding rotation angle (θ) for mirror 202 can be calculated using Equation (2) as follows:

$$\sin \theta = \frac{L}{d} \sin \alpha \quad (2)$$

where d is the distance between axis O$_m$ and the axis defined by the pair of torsional members 234 and labeled O$_h$ in FIGS. 3A–B. Since device 200 is preferably implemented such that L is significantly larger than d, a relatively small value of α will correspond to a relatively large value of θ. Similarly, in the corresponding embodiments of device 200, a relatively small value of effective angle α' (see Eq. (1)) will correspond to a relatively large value of θ.

Figure 4:
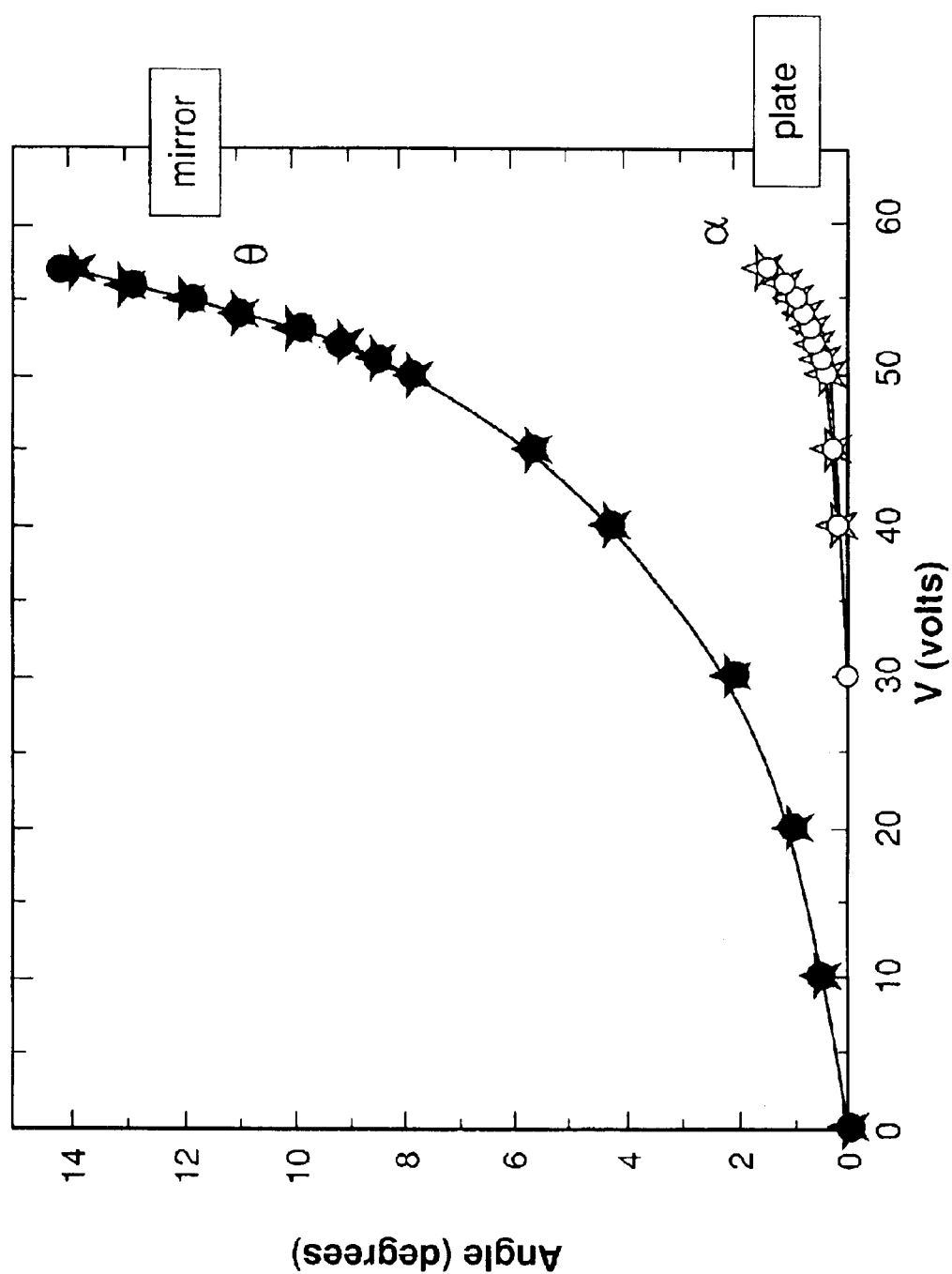
FIG. 4 graphically shows rotation angles for a representative implementation of the device shown in FIG. 2 as a function of the voltage differential applied between the electrode and actuator plate of that device.

FIG. 4 graphically shows the dependence of α and θ on the voltage differential applied between electrode 226 and plate 222 for a representative implementation of device 200. As indicated in FIG. 4, at about 55 V, plate 222 is rotated by about 1 degree while mirror 202 is rotated by about 11 degrees, thereby achieving an angle amplification factor of about 11.

Referring again to FIG. 3, in addition to the above-described angle amplification, during operation of device 200, an edge 302 of mirror 202 having the greatest displacement from its initial position is displaced in the direction away from substrate 204 rather than toward the substrate as in the prior art MEMS devices similar to device 100 of FIG. 1. As a result, for device 200, the value of the maximum rotation angle for mirror 202 will generally be limited by the size of plate 222 and/or handle portion 232 rather than the size of the mirror itself as in prior art device 100. Since the length of handle portion 232 may be significantly smaller than the full length of mirror 202, device 200 will generally have a greater value of the maximum possible rotation angle than device 100 for comparable dimensions (e.g., the mirror size and cavity depth).

Figure 5:
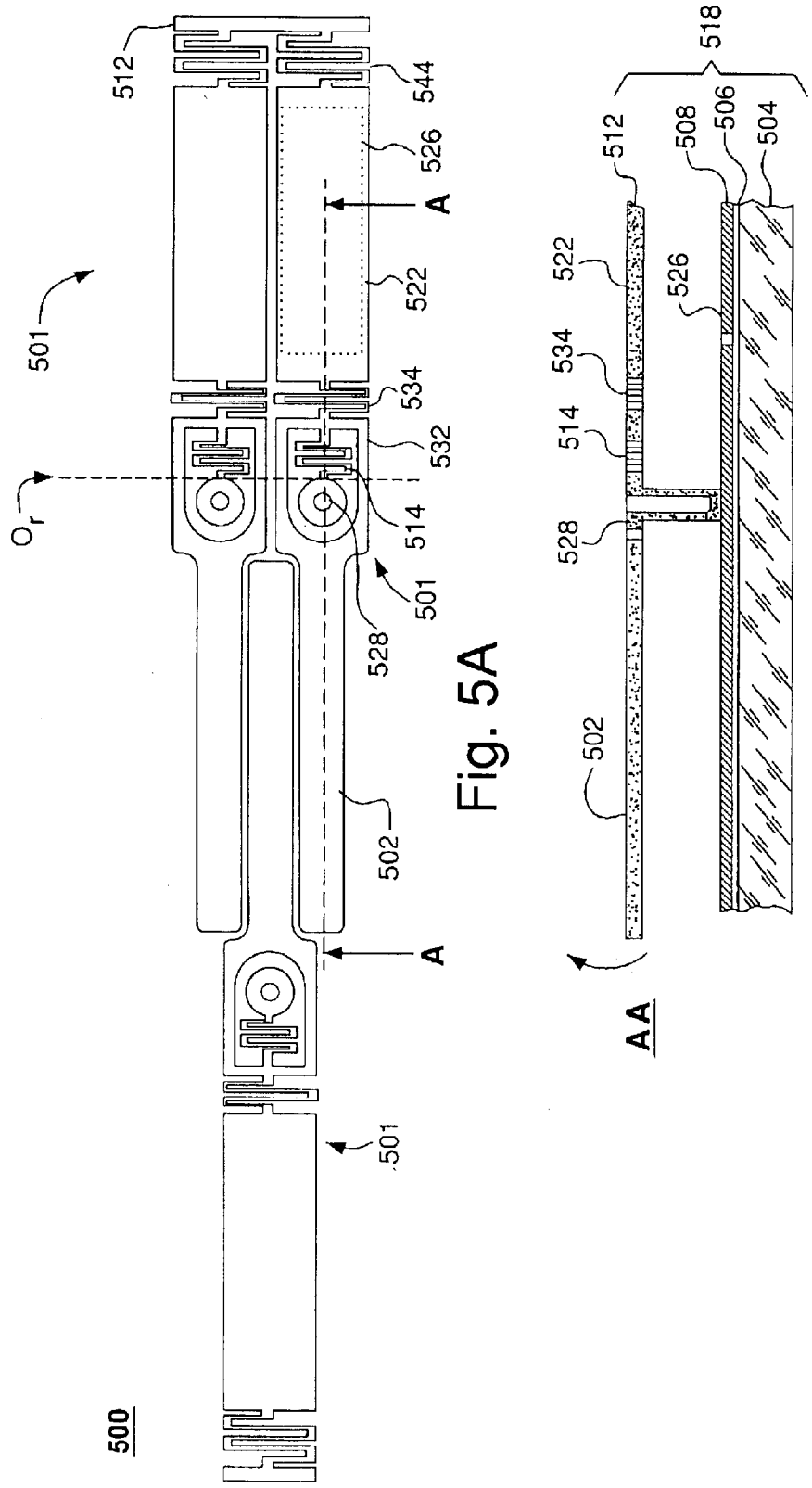
FIGS. 5A–B show top and cross-sectional views, respectively, of an arrayed MEMS device according to another embodiment of the present invention.

FIGS. 5A–B show top and cross-sectional views, respectively, of a MEMS subsystem 500 comprising three arrayed MEMS devices 501 according to another embodiment of the present invention. In a different embodiment, a different number of devices 501 may be similarly arrayed. FIG. 5B shows a cross-sectional view of one such device 501 along the plane designated AA in FIG. 5A. Similar to device 200 of FIG. 2, device 501 includes a movable mirror 502 mechanically coupled to a movable actuator plate 522, both formed in a top layer 512 of a wafer 518. Wafer 518 is similar to wafer 118 (FIG. 1) and, in addition to top layer 512, includes a substrate layer 504, a first insulating layer 506, a middle layer 508, and, in some cases, a second insulating layer (not shown) generally located between the top and middle layers. Plate 522 is supported above layers 504–508 by serpentine springs 534 and 544 attached to opposite ends of the plate. More specifically, spring 534 is attached between plate 522 and a handle portion 532 of mirror 502 while spring 544 is attached between the plate and the rest of (stationary) top layer 512. Mirror 502 is supported above layers 504–508 by a serpentine spring 514 attached between handle portion 532 and a stationary post 528.

Figure 6:
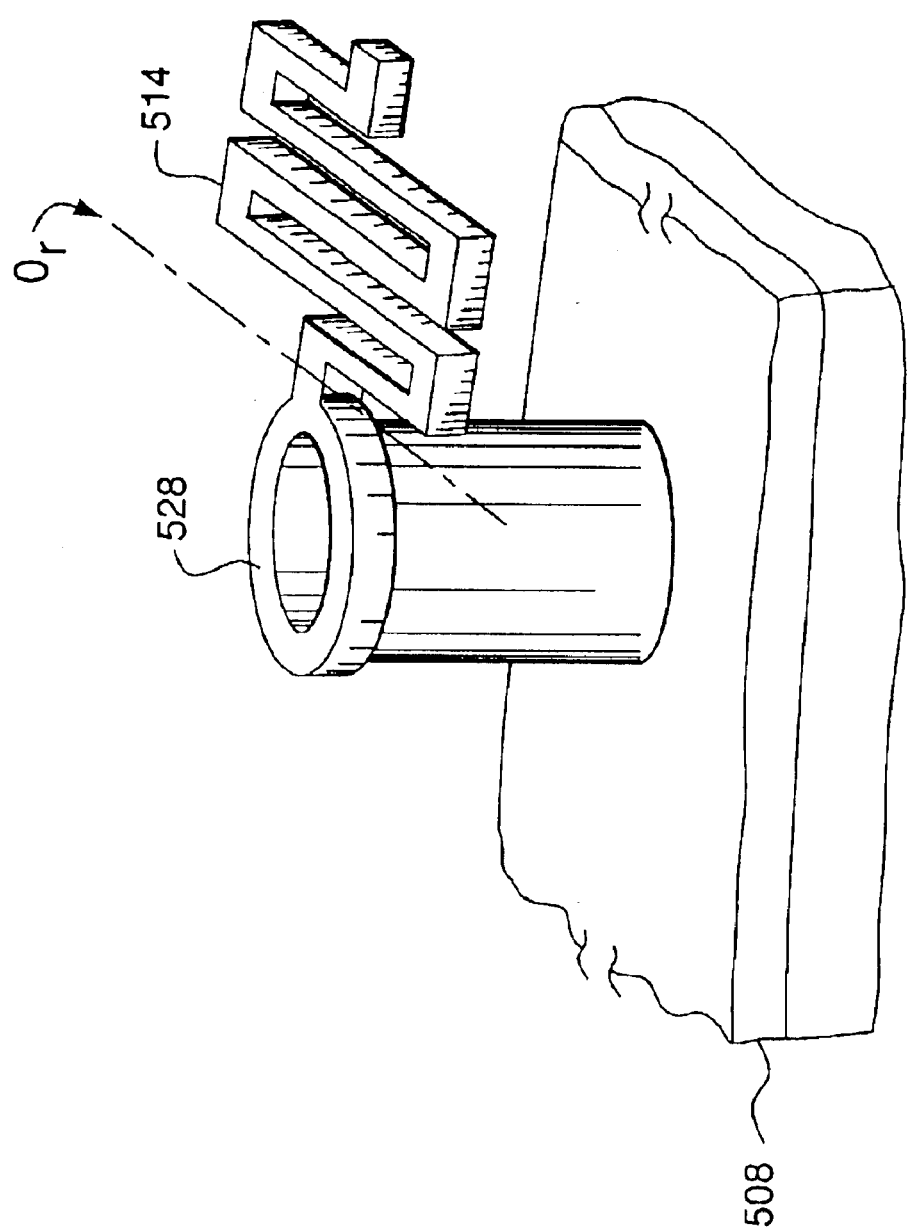
FIG. 6 shows an enlarged perspective view of a portion of the device shown in FIG. 5.

FIG. 6 shows an enlarged perspective view of a portion of device 501 including post 528 and spring 514. In one embodiment, post 528 is a hollow cylinder having a closed bottom attached to middle layer 508 of wafer 518. More details on the structure and fabrication of post 528 will be given below in the context of FIG. 7.

Referring again to FIG. 5, device 501 further includes an electrode 526 (indicated by the dotted line in FIG. 5A for one of devices 501) defined in middle layer 508 of wafer 518 and located beneath plate 522. Plate 522 and electrode 526 form an actuator of device 501. In operation, when electrode 526 is biased relative to plate 522, the plate moves (tilts and possibly translates) toward the electrode. Springs 534 and 544 provide a restoring force when they are stretched from their rest positions by the motion of the plate. The motion of plate 522 is transmitted via spring 534 to handle portion 532 of mirror 502. Since spring 514 anchors handle portion 532 to stationary post 528, motion of plate 522 toward electrode 526 results in a rotation of mirror 502 indicated by the arrow in FIG. 5B about the axis labeled $O_r$ in FIGS. 5A and 6. More specifically, axis $O_r$ lies in the plane of layer 512 near the area of attachment between spring 514 and post 528. Similar to motion of plate 222 and mirror 202 in device 200 (FIGS. 2–3), a relatively small displacement of plate 522 in device 501 causes rotation of mirror 502 by a relatively large angle.

FIGS. 7A–H illustrate representative fabrication steps of device 501 according to one embodiment of the present invention. More specifically, FIGS. 7A, 7C, 7E, and 7G show top views of the device during those fabrication steps, whereas FIGS. 7B, 7D, 7F, and 7H show the corresponding cross-sectional views along the plane designated BB in the top-view figures.

Referring to FIGS. 7A–B, in one embodiment, fabrication of device 501 begins with a wafer 718 having (i) two silicon layers, i.e., substrate layer 504 and overlayer 508 (see also FIG. 5B), and (ii) an insulating silicon nitride layer 506, which electrically isolates overlayer 508 from substrate layer 504. Electrode 526 and a contact pad 726 are defined in overlayer 508 of wafer 718 using grooves 704 that may be formed using reactive etching, which stops at layer 506.

Referring to FIGS. 7C–D, first, a silicon oxide layer 510 having the thickness corresponding to the distance, e.g., between electrode 526 and plate 522 (FIG. 5B) is deposited onto overlayer 508 of wafer 718, which layer becomes middle layer 508 (FIG. 5B). Then, layer 510 is patterned and etched to form openings 706, 708, and 710. Opening 706 is formed to accommodate post 528 (not yet formed); openings 708 are formed to accommodate support structures for layer 512 (not yet formed); and opening 710 is formed to provide access to contact pad 726. The processing illustrated in FIGS. 7C–D can be implemented using reactive etching, which stops at silicon layer 508.

Figure 7E:
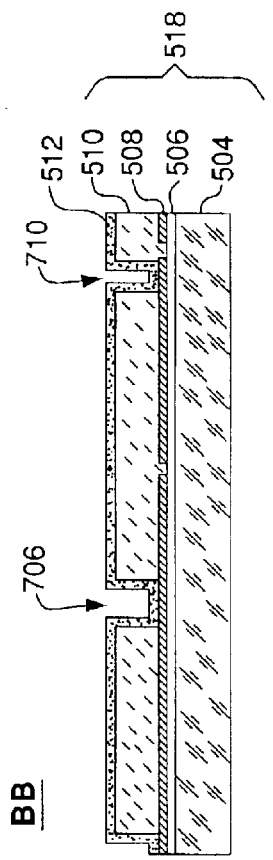
Figure 7F:

Referring to FIGS. 7E–F, a conformal poly-silicon layer 512 is deposited over oxide layer 510 and openings 706, 708, and 710. During deposition, conformal layer 512 covers all exposed surfaces, including the sidewalls of openings 706, 708, and 710, such that the thickness of this layer is approximately uniform and substantially independent of the orientation of the underlying surface. Methods of growing conformal layers are well known to persons skilled in the art. The portion of layer 512 corresponding to opening 706 is used in the next fabrication steps to form post 528; the portion of layer 512 corresponding to each opening 708 forms a corresponding support structure that attaches layer 512 to layer 508 and will keep the structure of device 501 intact after the partial removal of layer 510 in the next fabrication steps; and the portion of layer 512 corresponding to opening 710 is used in the next fabrication steps to form a contact pad for the electrical lead supplying bias voltage to contact pad 726 and electrode 526.

Figure 7G:
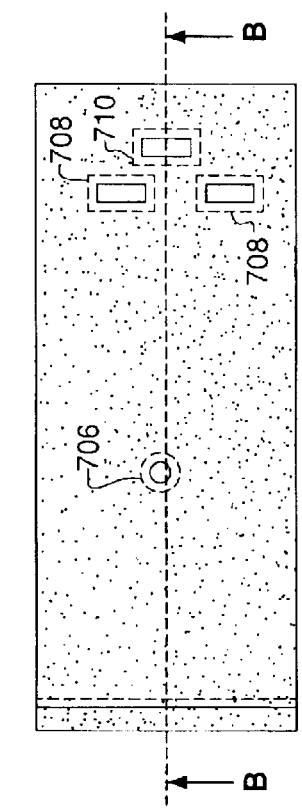
Figure 7H:
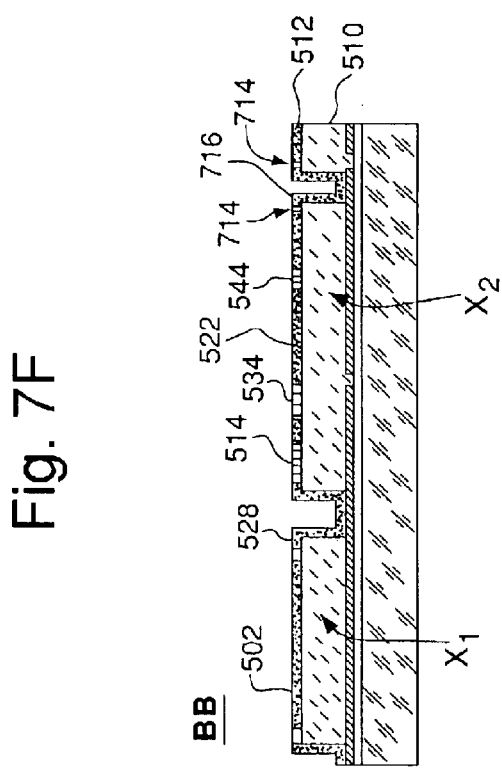

Referring to FIGS. 7G–H, layer 512 is first patterned and etched to define mirror 502, actuator plate 522, post 528, and springs 514, 534, and 544 and to form trenches 714. Trenches 714 define a contact pad 716 and electrically isolate this pad from the rest of layer 512. Then, portions of layer 510 labeled $X_1$ and $X_2$ in FIG. 7H are removed (e.g., etched away) to release mirror 502, actuator plate 522, and springs 514, 534, and 544 (see also FIG. 5B). A thin layer of metal (not shown), e.g., gold, is optionally deposited over mirror 502 for better reflectivity and/or over contact pad 716 for better electrical conductivity.

In a representative implementation of device 501, layer thicknesses and element sizes may be as follows: 700 $\mu$m for layer 504, 0.5 $\mu$m for layer 506, 1 $\mu$m for layer 508, 1 to 6 $\mu$m for layer 510, 2 $\mu$m for layer 512, about 100×10 $\mu$m² (length×width) for mirror 502, about 50×10 $\mu$m² for electrode 522, 0.5 $\mu$m (width) for springs 514, 534, and 544, and 10 $\mu$m (diameter) for post 528.

Different etching techniques may be used to fabricate device 501 from the initial wafer. It is known that silicon etches significantly faster than silicon oxide using, e.g., reactive ion etching (RIE). Similarly, silicon oxide etches significantly faster than silicon using, e.g., fluorine-based etchants.

Additional layers of material (e.g., layers 510 and 512, FIGS. 7C–F) may be deposited onto a wafer using, e.g., chemical vapor deposition. Various parts of the MEMS device may be mapped onto the corresponding layers using lithography. Current lithographic techniques are capable of defining details whose size is as small as about 0.25 microns. Additional description of various fabrication steps may be found in U.S. Pat. Nos. 6,201,631, 5,629,790, and 5,501,893, the teachings of which are incorporated herein by reference.

Although fabrication of MEMS devices of the invention has been described in the context of using silicon/silicon oxide/silicon nitride wafers, other suitable materials, such as germanium-compensated silicon, may similarly be used. The materials may be appropriately doped as known in the art. Various surfaces may be modified, e.g., by metal deposition for enhanced reflectivity and/or electrical conductivity or by ion implantation for enhanced mechanical strength. Differently shaped mirrors, actuator plates, posts, and/or electrodes may be implemented without departing from the scope and principle of the invention. Springs may have different shapes and sizes, where the term "spring" refers in general to any suitable elastic structure that can recover its original shape after being distorted. Various MEMS devices of the invention may be arrayed as necessary and/or apparent to a person skilled in the art.

While this invention has been described with reference to illustrative embodiments, this description is not intended to be construed in a limiting sense. Various modifications of the described embodiments, as well as other embodiments of the invention, which are apparent to persons skilled in the art to which the invention pertains are deemed to lie within the principle and scope of the invention as expressed in the following claims.

Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

What is claimed is:

1. A MEMS device, comprising:
first and second movable plates, each supported on and positioned offset from a substrate, wherein:
the second plate is supported by a spring attached between the second plate and a stationary post supported on the substrate;
each of the first and second plates is adapted to move with respect to the substrate, wherein the first plate is adapted to move in response to a voltage applied between an electrode and the first plate; and
the first and second plates are mechanically coupled together such that motion of the first plate with respect to the substrate produces motion of the second plate with respect to the substrate and with respect to the first plate.

2. The device of claim 1, wherein the second plate is adapted to rotate with respect to the substrate.

3. The device of claim 2, wherein:
a rotation axis of the second plate defines first and second portions of the second plate, said portions including opposite ends of the second plate with respect to the rotation axis;
the first plate is movably connected to the first portion; and
motion of the first plate toward the substrate produces motion of the second portion in a direction away from the substrate.

4. The device of claim 3, wherein length of the second portion is greater than length of the first portion.

5. The device of claim 2, wherein:
the first plate is adapted to rotate with respect to the substrate; and
rotation of the first plate by a first angle produces rotation of the second plate by a second angle whose magnitude is greater than the magnitude of the first angle.

6. The device of claim 5, wherein, when the first plate rotates in one direction, the second plate rotates in the opposite direction.

7. The device of claim 1, wherein:
a first end of the first plate is movably connected to the second plate;
a second end of the first plate is connected to the substrate;
the connection between the first plate and the substrate is a flexible connection; and
displacement of the first end of the first plate corresponds to displacement of the first plate relative to the substrate.

8. The device of claim 1, wherein:
a first end of the first plate is movably connected to the second plate;
a second end of the first plate is connected to the substrate;
the connection between the first plate and the substrate is a rigid connection; and
displacement of the first end of the first plate corresponds to bending of the first plate.

9. The device of claim 1, wherein:
the second plate has a reflective surface; and
the device is configured as an optical cross-connect.

10. The device of claim 1, wherein the device is part of an array of MEMS devices supported on the substrate.

11. A MEMS device, comprising:
first and second plates, each supported on and positioned offset from a substrate, wherein:
the second plate is rotatably connected to the substrate, wherein the rotatable connection defines a rotation axis of the second plate, the rotation axis defining first and second portions of the second plate, said portions including opposite ends of the second plate with respect to the rotation axis;
a first end of the first plate is movably connected to the first portion of the second plate;
a second end of the first plate is connected to the substrate; and
the connection between the first plate and the substrate is a flexible connection and displacement of the first end of the first plate corresponds to displacement of the first plate relative to the substrate.

12. The device of claim 11, further comprising an electrode positioned between the first plate and the substrate and electrically isolated from the first plate.

13. The device of claim 11, wherein, when the first end of the first plate is moved toward the substrate, the second plate rotates such that the second portion of the second plate moves away from the substrate.

14. The device of claim 13, wherein the magnitude of the rotation of the second plate is greater than the magnitude of an angle corresponding to the displacement of the first end of the first plate.

15. The device of claim 11, wherein the rotatable connection between the second plate and the substrate is provided by one or more torsional springs.

16. The device of claim 11, wherein the rotatable connection between the second plate and the substrate is provided by a serpentine spring.

17. The device of claim 11, wherein the movable connection between the first end of the first plate and the first portion of the second plate is provided by one or more torsional springs.

18. The device of claim 11, wherein the movable connection between the first end of the first plate and the first portion of the second plate is provided by a serpentine spring.

19. The device of claim 11, wherein:
the first plate is adapted to rotate with respect to the substrate; and
rotation of the first plate by a first angle produces rotation of the second plate by a second angle whose magnitude is greater than the magnitude of the first angle.

20. A MEMS device, comprising:
first and second plates, each supported on and positioned offset from a substrate, wherein:
the second plate is rotatably connected to the substrate, wherein the rotatable connection defines a rotation axis of the second plate, the rotation axis defining first and second portions of the second plate, said portions including opposite ends of the second plate with respect to the rotation axis;
a first end of the first plate is movably connected to the first portion of the second plate;
a second end of the first plate is connected to the substrate; and
the connection between the first plate and the substrate is a rigid connection and displacement of the first end of the first plate corresponds to bending of the first plate.

* * * * *